(12) United States Patent
Wang et al.

(10) Patent No.: US 11,860,462 B2
(45) Date of Patent: Jan. 2, 2024

(54) ELECTRONIC DISPLAY ASSEMBLY AND DOUBLE-SIDED DISPLAY

(71) Applicant: DYNASCAN TECHNOLOGY CORP., Taoyuan (TW)

(72) Inventors: Tsun-I Wang, Taoyuan (TW); Ching-Chun Wu, Taoyuan (TW); Chia-Liang Yang, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 272 days.

(21) Appl. No.: 16/982,982

(22) PCT Filed: Aug. 13, 2020

(86) PCT No.: PCT/CN2020/108935
§ 371 (c)(1),
(2) Date: Sep. 21, 2020

(87) PCT Pub. No.: WO2022/032578
PCT Pub. Date: Feb. 17, 2022

(65) Prior Publication Data
US 2022/0252927 A1    Aug. 11, 2022

(51) Int. Cl.
*H05K 7/20* (2006.01)
*H05K 5/03* (2006.01)
*G02F 1/1333* (2006.01)

(52) U.S. Cl.
CPC .. *G02F 1/133385* (2013.01); *G02F 1/133331* (2021.01); *G02F 1/133342* (2021.01); *H05K 7/20209* (2013.01); *H05K 7/20972* (2013.01)

(58) Field of Classification Search
CPC ........... H05K 7/20972; H05K 7/20145; H05K 7/202; H05K 7/20136; H05K 7/20154;
(Continued)

(56) References Cited

U.S. PATENT DOCUMENTS 5,869,919 A * 2/1999 Sato ...................... H01J 29/006
313/496
5,991,153 A * 11/1999 Heady ................ H05K 7/20972
361/679.48
(Continued)

FOREIGN PATENT DOCUMENTS

| CN | 111263576 A | 6/2020 |
| CN | 211019773 U | 7/2020 |
| JP | 2000244165 A | 9/2000 |

OTHER PUBLICATIONS

Cheng Hanwei, Internal Circulation heat dissipation device of advertising machine, Jul. 14, 2020. 16982982 translation. (Year: 2020).*

*Primary Examiner* — Michael A Matey
(74) *Attorney, Agent, or Firm* — Duane Morris LLP (57) ABSTRACT

An electronic display assembly and a double-sided display are provided. The electronic display assembly comprises a case with an opening, a display panel, an air-interchange device and a flow generator. The air-interchange device is arranged in the opening of the case. The flow generator generates airflow through a pathway within the case. The direction of a first portion of the pathway near the air-interchange device is not parallel to a normal of the opening.

20 Claims, 7 Drawing Sheets

(58) Field of Classification Search
CPC .......... H05K 7/20163; H05K 7/20172; H05K 7/20209; H05K 7/20954; H05K 7/20963; H05K 5/0213; G02F 1/133385; G02F 2201/36; G02F 1/133628; G02F 1/133342; G06F 1/20; G06F 1/1601
See application file for complete search history.

(56) References Cited

U.S. PATENT DOCUMENTS

| | | | | |
|---|---|---|---|---|
| 8,654,302 | B2* | 2/2014 | Dunn | H05K 7/20136 165/104.34 |
| 9,470,924 | B2* | 10/2016 | Dunn | H05K 7/20972 |
| 10,321,614 | B1* | 6/2019 | Huang | G02F 1/1336 |
| 10,642,327 | B1* | 5/2020 | Silvanto | H05K 7/20209 |
| 10,754,184 | B2* | 8/2020 | Wang | G02F 1/133385 |
| 11,044,840 | B2* | 6/2021 | Kang | H05K 7/20209 |
| 2003/0043091 | A1* | 3/2003 | Takeuchi | G02B 26/02 345/84 |
| 2007/0216273 | A1* | 9/2007 | Yanagawa | H05K 7/20972 313/46 |
| 2010/0171889 | A1* | 7/2010 | Pantel | G02F 1/133308 349/1 |
| 2011/0058326 | A1* | 3/2011 | Idems | G09F 9/30 361/679.21 |
| 2011/0085301 | A1* | 4/2011 | Dunn | G02F 1/133385 361/695 |
| 2011/0085302 | A1* | 4/2011 | Nakamichi | H05K 7/20972 361/695 |
| 2011/0167845 | A1* | 7/2011 | Lee | F04D 25/166 165/104.34 |
| 2012/0255721 | A1* | 10/2012 | Kim | G09F 19/22 362/97.1 |
| 2015/0237761 | A1* | 8/2015 | Dunn | H05K 7/20972 362/97.3 |
| 2016/0135607 | A1* | 5/2016 | Ocegueda | A47C 21/044 5/423 |
| 2018/0259806 | A1* | 9/2018 | Oh | G06F 1/1601 |
| 2018/0317350 | A1* | 11/2018 | Dunn | G02F 1/133308 |
| 2021/0303043 | A1* | 9/2021 | Lee | H05K 7/20972 |

* cited by examiner

ELECTRONIC DISPLAY ASSEMBLY AND DOUBLE-SIDED DISPLAY

BACKGROUND

1. Field of the Disclosure

The present disclosure relates to display apparatuses. More particularly, the present disclosure relates to display apparatuses with an air-interchange device.

2. Description of the Related Art

As display apparatuses are widely used in different environments, ensuring reliability and robustness under harsh conditions has become an important issue. For example, if a display apparatus is placed outdoors, sunlight may raise the temperature of the display apparatus rapidly, whereby heat and moisture accumulating in the optical cavity of the display apparatus can degrade normal functionality, such that optical components may suffer reduced lifetime or even break down.

Generally, the optical cavity of a display apparatus has a substantially airtight design to prevent incursion of dust and other contaminants. Unfortunately, accumulated heat and moisture cannot dissipate to the external environment. The resulting thermal expansion of gases in the optical cavity can deform optical components such as liquid crystal panel, optical films and diffusion plate. For high-brightness commercial display apparatus or display apparatus exposed to sunlight, such deformation issues are even more pronounced.

SUMMARY

Accordingly, there is a need for an improved display apparatus to prevent the stated defects, to ensure that the display apparatus continues to function properly and to extend the display apparatus' lifetime.

In one aspect according to some embodiments, an electronic display assembly is provided. The electronic display assembly includes a case with an opening, a display panel, an air-interchange device and a flow generator. The air-interchange device is arranged in the opening of the case. The flow generator generates airflow through a pathway within the case. The direction of a first portion of the pathway near the air-interchange device is not parallel to a normal of the opening.

In a preferred embodiment, the air-interchange device comprises a screen filter, a one-way breathable valve, a two-way breathable valve, or two valves with different directions.

In a preferred embodiment, when the first flow generator is operated, ambient air enters the case of the electronic display assembly via the air-interchange device and air inside of the case exits the electronic display assembly via the air-interchange device.

In a preferred embodiment, the first flow generator is triggered when the temperature inside the electronic display assembly exceeds a threshold.

In a preferred embodiment, ventilation rate of the air-interchange device is proportional to the velocity of the internal airflow generated by the first flow generator.

In a preferred embodiment, ventilation rate of the air-interchange device is proportional to the size of an opening of the air-interchange device.

In one aspect according to some embodiments, an electronic display assembly is provided. The electronic display assembly includes a case, a transparent plate, a display module, an air-interchange device and a flow generator. The air-interchange device is sealed with the case for ventilating the electronic display assembly with airflow with more than one direction. The flow generator generates an airflow between the transparent plate and the display module and passing a side of the air-interchange device.

In one aspect according to some embodiments, a double-sided display is provided. The double-sided display comprises a first electronic display assembly as described, a second electronic display assembly as described, and a dual-sided housing with an opening. The dual-sided housing is used for accommodating a portion of the first electronic display assembly and a portion of the second electronic display assembly.

Other aspects and embodiments of the present disclosure are also contemplated. The foregoing summary and the following detailed description are not meant to limit the present disclosure to any particular embodiment but are merely meant to describe some embodiments of the present disclosure.

BRIEF DESCRIPTION OF THE DRAWINGS

For a better understanding of the nature and objects of some embodiments of the present disclosure, reference should be made to the following detailed description taken in conjunction with the accompanying drawings. In the drawings, identical or functionally identical elements are given the same reference numbers unless otherwise specified.

DETAILED DESCRIPTION

The present disclosure provides an electronic display assembly or a double-sided display with an air-interchange device. The present disclosure further provides an electronic display assembly or a double-sided display with a dynamically adjustable airtight state inside the optical cavity. The present disclosure further provides an electronic display assembly or a double-sided display with environmental regulation capability. Embodiments of electronic display assembly or the double-sided display described herein comprise one or more air-interchange devices. By using the air-interchange devices, the pressure in the optical cavity (accommodation space) of the electronic display assembly or the double-sided display can be balanced with the pressure of the external environment. Due to the ventilation effect via the air-interchange device, heat, moisture, or small particles accumulated within the optical cavity of the display can be exhausted via the air-interchange device, thereby reducing the temperature, humidity or density of small particles inside the display. Embodiments of electronic display assembly or the double-sided display described herein can effectively solve the problem of deformation of optical elements inside the electronic display assembly or the double-sided display. Furthermore, the design of the filter materials included in the air-interchange device prevents contaminants of any size from entering the display. Accordingly, the electronic display assembly and the double-sided display of the present disclosure are suitable for outdoor use.

Figure 1:
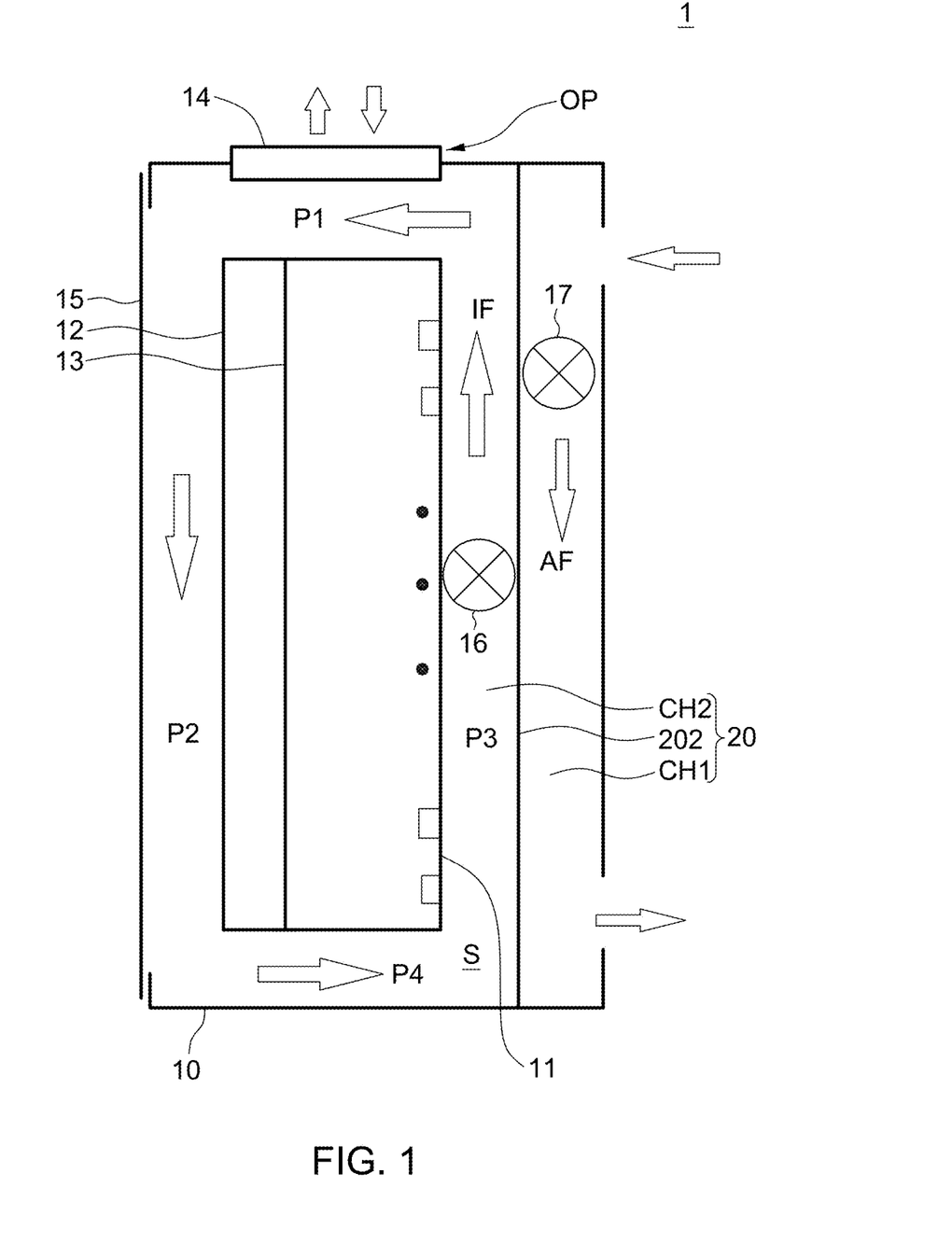
FIG. 1 is a cross-sectional view of an electronic display assembly according to some embodiments of the present disclosure.

FIG. 1 is a cross-sectional view of an electronic display assembly according to some embodiments of the present disclosure. According to some embodiments of the present disclosure, an electronic display assembly 1 includes a case 10, a display panel 12, an air-interchange device 14, and a flow generator 16. According to some embodiments of the present disclosure, the electronic display assembly 1 may further include at least one of a backlight module 11, an optical film 13, a transparent plate 15, a flow generator 17, and a heat exchanger 20.

The transparent plate 15 may be disposed in the display opening of the front portion of the case 10. The display panel 12 may be, for example, a liquid crystal panel disposed between the transparent plate 15 and the backlight module 11. The optical film 13 may be disposed between the display panel 12 and the backlight module 11. The optical film 13 can be, for example, a light diffuser, a light reflector, a brightness enhancement film, or a combination of two or more thereof.

In this embodiment, the electronic display assembly 1 is, for example, a liquid crystal display with a direct LED backlight module. For the sake of simplicity, a liquid crystal display with a direct LED backlight module is described in the subsequent embodiments. Please note that a liquid crystal display with an edge-lit backlight module or an OLED display without the backlight module can also be used in the subsequent embodiments, which is not limited herein.

The case 10 has an opening OP. The size of the opening OP is arranged for accommodating the air-interchange device 14. The normal of the opening OP is not parallel to the normal of the plan of the display panel 12. For example, the normal of the opening OP may be perpendicular to the normal of the plan of the display panel 12. The air-interchange device 14 may be, for example, embedded in the opening OP of the case 10. The air-interchange device 14 may be, for example, sealed with the case 10 via adhesive for ventilating the electronic display assembly 1 with airflow with more than one direction. In some embodiments, the air-interchange device 14 is arranged on the top of the electronic display assembly 1. In some other embodiments, the position of the air-interchange device 14 arranged on the case 10 can be determined based on situational needs as long as the air-interchange device 14 does not block the display panel 12.

In a preferred embodiment, the air-interchange device 14 is a two-way breathable device, such as a two-way breathable valve. In another preferred embodiment, the air-interchange device 14 is a screen filter or any ventilation material that can filter pollutants such as dust or dirt. In yet another preferred embodiment, the air-interchange device 14 is a combination of one or more valves and a filter. In some other embodiments, the air-interchange device is a one-way air-interchange device, such as a one-way breathable valve. In some other embodiments, the air-interchange device is two or more breathable components with different intake directions, such as two or more valves with different directions.

The flow generator 16 is, for example, a fan disposed in the optical cavity/accommodation space S of the case 10 and configured to generate an internal airflow through the pathway in the accommodation space S of the case 10 so as to form an internal circulating airflow IF. As shown in FIG. 1, the pathway is composed of portions P1, P2, P3 and P4. The portion P1 of the pathway is adjacent to a side of the air-interchange device 14. The portion P2 of the pathway is located between the transparent plate 15 and the display panel 12. The portion P3 of the pathway is adjacent to the back side of the backlight module 11. The portion P4 of the pathway is located on the bottom of the electronic display assembly 1.

In some embodiments, the flow generator 16 is triggered when the temperature inside of the electronic display assembly 1 exceeds a threshold. In some embodiments, the flow generator 16 is triggered when the pressure inside of the electronic display assembly 1 exceeds a threshold. In some other embodiments, the flow generator 16 will automatically run when the electronic display assembly 1 is turned on, and it automatically stops when the electronic display assembly 1 is turned off. It is worth noting that the number of flow generators 16 inside the accommodation space S is not limited in view of embodiments of the present disclosure.

When the flow generator 16 is operated, a forced airflow will be generated to form internal circulating airflow IF. The flow generator 16 generates an airflow between the transparent plate 15 and the display panel 12 and passing a side of the air-interchange device 14. As shown in the embodiment of FIG. 1, the internal circulating airflow IF flows between the transparent plate 15 and the display panel 12, so as to transfer the heat caused by sunlight emitted through the transparent plate 15. The internal circulating airflow IF also passes the back side of the backlight module 11, so as to transfer the heat generated by the backlight module. The heat accumulated in the case 10 is released to the external environment through the air-interchange device 14.

The internal circulating airflow IF flows through portion P1 of the pathway and generates a wind pressure to impact the air-interchange device 14 (e.g., a two-way breathable valve including a screen filter). The wind pressure will lead to a ventilation effect of the air-interchange device 14. Specifically, when the internal circulating airflow IF flows, the ambient air enters the case 10 of the electronic display assembly 1 via the air-interchange device 14 due to the wind pressure caused by the internal circulating airflow IF and the air inside of the case 10 exits the electronic display assembly 1 via the air-interchange device 14 simultaneously. The amount of air intake and the amount of air output may not be the same. For example, if the temperature or pressure within the case 10 is higher than that of the external environment, the amount of air output exceeds that of air intake. In some embodiments, the ventilation rate of the air-interchange device is proportional to the velocity of the internal airflow generated by the flow generator 16. In some embodiments, the ventilation rate of the air-interchange device 14 is proportional to the opening size of the air-interchange device 14. In some embodiments, the ventilation rate of the air-interchange device 14 is proportional to the air permeability of the filter included in the air-interchange device 14.

Due to the air exchange via the air-interchange device 14, heat generated by sunlight and/or the backlight module 11 (or other components) of the electronic display assembly 1 can be transferred to the external environment, whereby the temperature of the electronic display assembly 1 is reduced. Accordingly, the use of the air-interchange device 14 can effectively solve the problem of optical element deformation caused by high temperature inside the electronic display assembly 1 and optical defects caused by the friction between the optical element elements due to deformation of the optical elements (e.g., display panel 12, optical film 13 etc.). Additionally, moisture inside the accommodation space S of the case 10 can also be exhausted via the air-interchange device 14. In some embodiments, when the electronic display assembly 1 is turned off, the flow generator 16 automatically stops. As the wind pressure stops, the internal circulating airflow IF will also stop, which will cause the ventilation effect to stop synchronously. This prevents moisture from entering the accommodation space S of the case 10 when the electronic display assembly 1 is turned off. Furthermore, due to the air exchange via the air-interchange device 14, the pressure inside the accommodation space S of the case 10 is balanced with the pressure of the external environment.

By using the air-interchange device 14 comprising a valve, the case 10 can be in the airtight state most of the time and larger particles or contaminants are prevented from entering the case 10. The valve is open when the air pressure inside or outside of the case 10 are different and a force caused by the pressure difference is sufficient to open the valve. For example, as the temperature in the case 10 increases, the pressure inside of the case 10 increases. The air pressure inside of the case 10 increases until the valve is opened by the air pressure. When the valve is open, the air with high temperature within the case exists through the valve and ambient air with lower temperature enters the case 10. Thus, the temperature inside of cases decreases rapidly.

By using the screen filter of the air-interchange device 14, when the ambient air enters the case 10 of the electronic display assembly 1, the dust or dirt will be filtered by the screen filter of the air-interchange device 14; thereby preventing contaminants of any size from entering the electronic display assembly 1. When the air inside of the case 10 exits the electronic display assembly 1 via the air-interchange device 14, the thrust of the exhaust gas pushes out the dust attached to the filter, thereby increasing the service life of the screen filter included in the air-interchange device 14.

In this embodiment, only one air-interchange device is used. It is worth noting that the number and mounting position of the air-interchange device can be determined based on situational needs and is not limited in view of embodiments in the present disclosure. Although the electronic display assembly of the embodiments of the present disclosure is described with a liquid crystal display as an example, the air-interchange device of the present disclosure can also be applied to other types of display apparatuses such as OLEDs.

In FIG. 1, the electronic display assembly 1 further includes a heat exchanger 20 which is disposed in the mounting opening of the rear portion of the case 10. The external heat dissipation channel CH1 and the internal heat dissipation channel CH2 (i.e., the portion P3 of the pathway) and the thermal conductive portion 202 together form the heat exchanger 20. The thermal conductive portion 202 is, for example, a metal plate made of aluminum. It is worth noting that any airflow in the internal heat dissipation channel CH2 is independent from the ambient airflow AF in the external heat dissipation channel CH1.

An internal portion of the heat exchanger 20 is disposed in the accommodation space S of the case 10. The inner side surface of the heat exchanger 20 is attached to the back side of the backlight module 11, such that the backlight module 11 is in thermal contact with the heat exchanger 20. The internal heat dissipation channel CH2 of the heat exchanger 20 is fluidly connected with the pathway within the case 10, such that the airflow generated by the flow generator 16 in the case 10 is enabled to pass through the internal heat dissipation channel CH2 of the heat exchanger 20. An external portion of the heat exchanger 20 protrudes out of the rear portion of the case 10 from the mounting opening, and the external heat dissipation channel are fluidly connected with the external environment.

The electronic display assembly 1 further includes another flow generator 17. The flow generator 17 is, for example, a fan to facilitate an ambient air AF flowing through the external heat dissipation channel CH1, so as to bring the heat conducted by the heat exchanger 20 to the external environment.

The ambient airflow AF (such as cold air) flows in the external heat dissipation channel CH1 of the heat exchanger 20. The high temperature airflow in the portion P3 of the pathway raises the temperature of the internal portion of the heat exchanger 20, and the ambient airflow AF in the external heat dissipation channel CH1 reduces the temperature of the external portion of the heat exchanger 20. Therefore, due to the thermal contact between the internal portion and the external portion of the heat exchanger 20 via the thermal conductive portion 202, heat generated by sunlight and/or the backlight module 11 of the electronic display assembly 1 will be transferred to the external environment through the heat exchanger 20 more quickly, thereby reducing the temperature inside the electronic display assembly 1.

Figure 2:
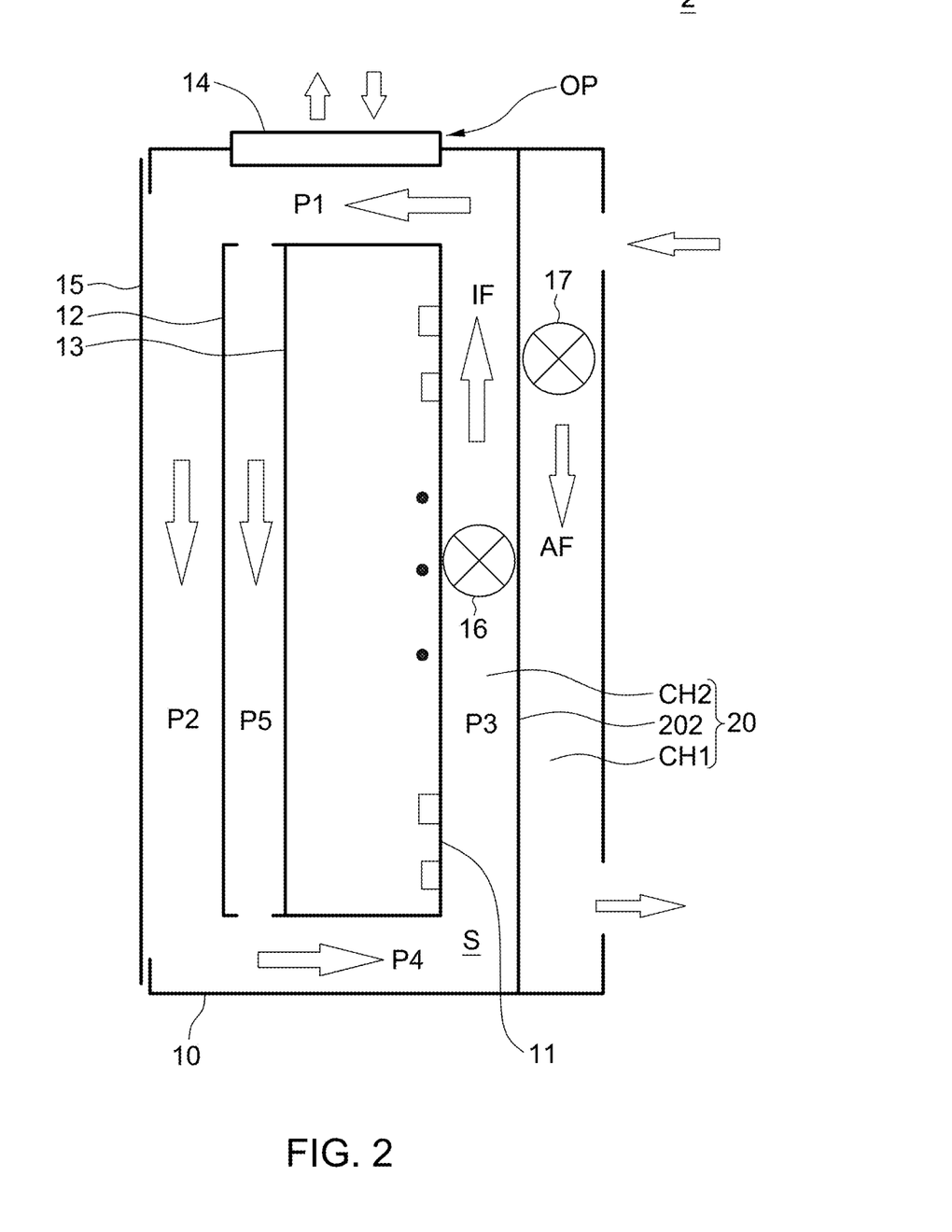
FIG. 2 is a cross-sectional view of an electronic display assembly according to some embodiments of the present disclosure.

FIG. 2 is a cross-sectional view of an electronic display assembly according to some embodiments of the present disclosure. According to some embodiments of the present disclosure, an electronic display assembly 2 includes a case 10, a display panel 12, an air-interchange device 14, and a flow generator 16. According to some embodiments of the present disclosure, the electronic display assembly 2 may further include at least one of a backlight module 11, an optical film 13, a transparent plate 15, a flow generator 17 and a heat exchanger 20. The transparent plate 15 may be disposed in the display opening of the front portion of the case 10. The display panel 12 may be, for example, a liquid crystal panel and disposed between the transparent plate 15 and the optical film 13. The optical film 13 can be, for example, a light diffuser, a light reflector, a brightness enhancement film, or a combination of two or more thereof.

One difference between the electronic display assembly 2 shown in FIG. 2 and the electronic display assembly 1 shown in FIG. 1 is the composition of the pathway inside the case 10. Specifically, the pathway is composed of portions P1, P2, P3, P4 and P5. The portion P1 of the pathway is adjacent to a side of the air-interchange device 14. The portion P2 of the pathway is located between the transparent plate 15 and the display panel 12. The portion P3 of the pathway is located between the back side of the backlight module 11 and the thermal conductive portion 202 of the heat exchanger 20. The portion P4 of the pathway is located on the bottom of the electronic display assembly 2. The portion P5 of the pathway is located between the display panel 12 and the optical film 13.

The heat exchanger 20 and the air-interchange device 14 according to this embodiment are favorable for dissipating heat accumulated in the electronic display assembly 2, so as to reduce the temperature within the electronic display assembly 2. Heat accumulated in the electronic display assembly 2 is mainly heat generated by exposure to sunlight, or by light sources of the backlight module 11 and/or other electronic components in the electronic display assembly 2. It should be noted that because there are two air pathways on the front and back sides of the display panel 12, the heat accumulated by sunlight on the transparent plate 15 and the display panel 12 can be quickly guided to the internal heat dissipation channel CH2 of the heat exchanger 20. Due to the thermal contact between the internal heat dissipation channel CH2 and the external heat dissipation channel CH1 of the heat exchanger 20 via the thermal conductive portion 202 and the ventilation effect of the air-interchange device 14, the overall temperature inside of the electronic display assembly 2 can be reduced more quickly.

The other components in the electronic display assembly 2 of FIG. 2 with the same reference numerals as those of the electronic display assembly 1 of FIG. 1 refer to the same or similar components, and thus their detailed descriptions are not repeated here.

Figure 3:
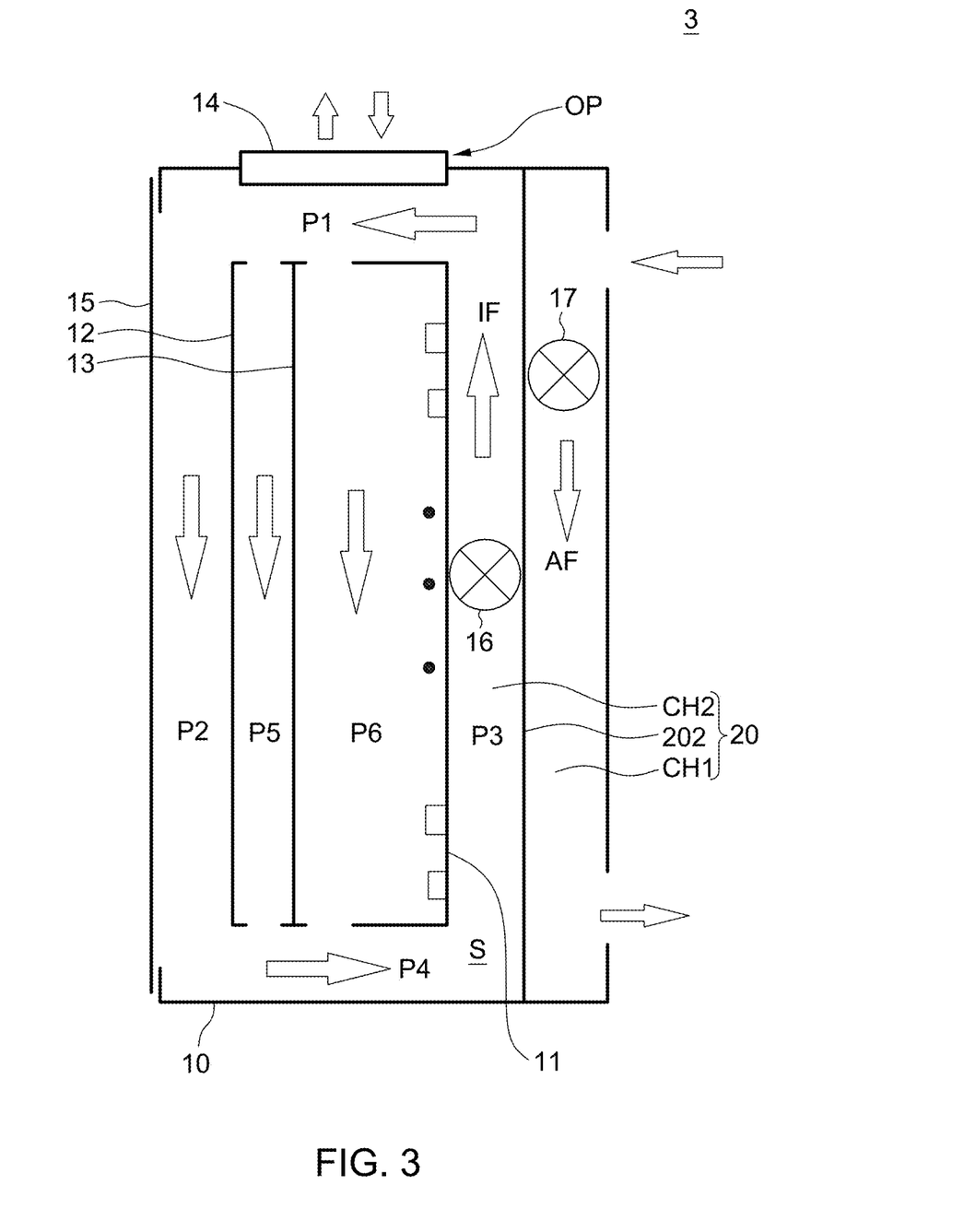
FIG. 3 is a cross-sectional view of an electronic display assembly according to some embodiments of the present disclosure.

FIG. 3 is a cross-sectional view of an electronic display assembly 3 according to some embodiments of the present disclosure. According to some embodiments of the present disclosure, an electronic display assembly 2 includes a case 10, a display panel 12, an air-interchange device 14, and a flow generator 16. According to some embodiments of the present disclosure, the electronic display assembly 2 may further include at least one of a backlight module 11, an optical film 13, a transparent plate 15, a flow generator 17, and a heat exchanger 20. The transparent plate 15 may be disposed in the display opening of the front portion of the case 10. The display panel 12 may be, for example, a liquid crystal panel disposed between the transparent plate 15 and the optical film 13. The optical film 13 may be disposed between the display panel 12 and the backlight module 11.

One difference between the electronic display assembly 3 shown in FIG. 3 and the electronic display assembly 2 shown in FIG. 2 is the composition of the pathway inside the case 10. Specifically, the pathway is composed of portions P1, P2, P3, P4, P5 and P6. The portion P1 of the pathway is adjacent to a side of the air-interchange device 11, The portion P2 of the pathway is located between the transparent plate 15 and the display panel 12, The portion P3 of the pathway is located between the back side of the backlight module 11 and the thermal conductive portion 202 of the heat exchanger 20. The portion P4 of the pathway is located on the bottom of the electronic display assembly 3. The portion P5 of the pathway is located between the display panel 12 and the optical film 13. The portion P6 of the pathway is located between the optical film 13 and the front side of the backlight module 11.

It should be noted that compared with the electronic display assembly 1 shown in FIG. 1 or the electronic display assembly 2 shown in FIG. 2, the heat generated by the light sources of backlight module 11 of the electronic display assembly 3 shown in FIG. 3 can be dissipated more quickly because there are two air pathways (i.e., P2 and P5) on the front and back sides of the display panel 12 and two air pathways (i.e., P6 and P3) on the front and back sides of the backlight module 11.

It should be noted that the gap of each of the portions P1, P2, P3, P4, P5 and P6 of the pathway in the embodiments of the present disclosure can be properly adjusted based on situational needs such that the internal circulating airflow IF can flow through these portions P1, P2, P3, P4, P5 and P6 of the pathway.

Figure 4A:
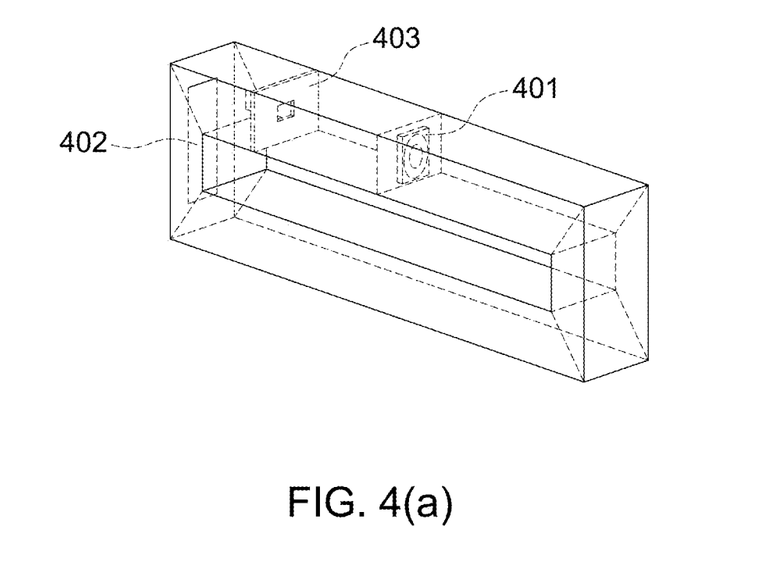
FIGS. 4(a), 4(b) and 4(c) are schematic diagrams illustrating the internal circulating airflow inside the optical cavity and the disturbed airflow around the opening of the air-interchange device of the electronic display assembly according to some embodiments of the present disclosure.
Figure 4B:
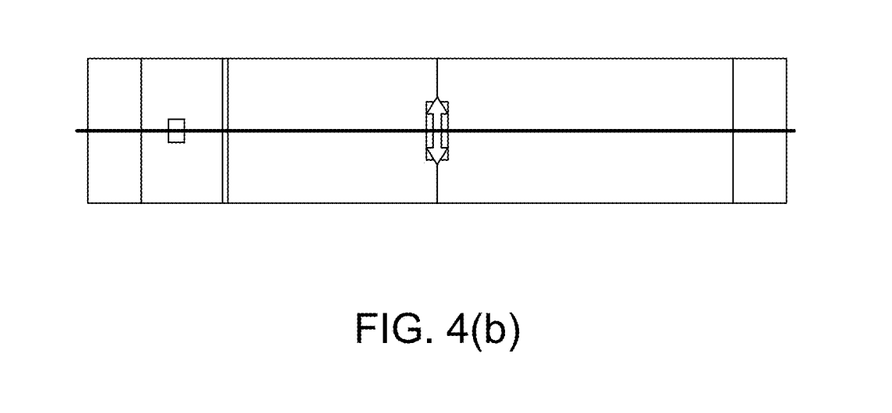
Figure 4C:
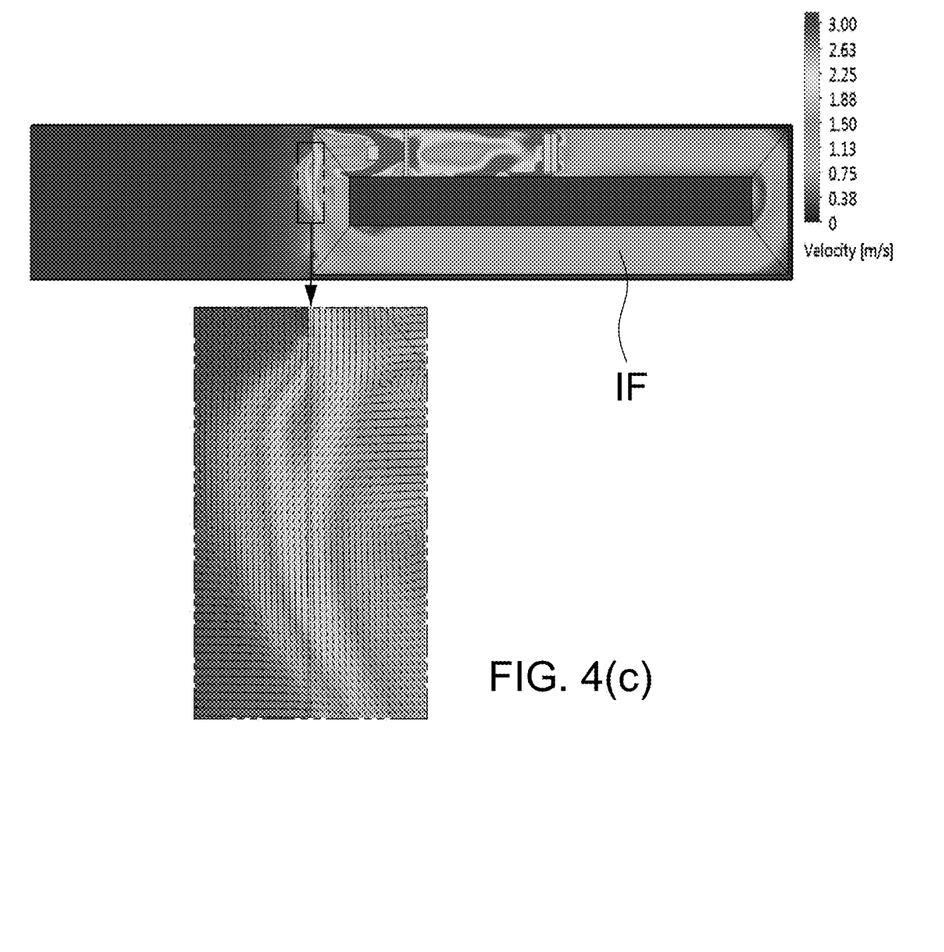

FIGS. 4(a), 4(b) and 4(c) are schematic diagrams illustrating the internal circulating airflow inside the optical cavity and the disturbed airflow around the opening of the air-interchange device of the electronic display assembly according to some embodiments of the present disclosure.

FIG. 4(a) is a schematic diagram illustrating a simplified simulation environment of an electronic display assembly (e.g., the electronic display assembly 1 shown in FIG. 1). FIG. 4(b) is a top view of the electronic display assembly. Element 401 is used as a flow generator (e.g., the flow generator 16 shown in FIG. 1). Element 402 is used as an air-interchange device (e.g., the air-interchange device 14 shown in FIG. 1). Element 403 is a measurement element for measuring the airflow rate, and thus it will riot be installed in the electronic display assembly in practical applications. Please note that in this simulation, the size of the opening of the air-interchange device 402 is 200×90 mm.

FIG. 4(c) shows that when the flow generator 401 is operated, the internal circulating airflow IF is generated and the disturbed airflow near the opening of the air-interchange device is also generated. According to the enlarged schematic diagram of the airflow in the opening of the air-interchange device in FIG. 4(c), it can be proved that when the internal circulating airflow IF passes through the air-interchange device, the ambient air enters the electronic display assembly via a first portion of the air-interchange device, and airflow exits the electronic display assembly 1 via a second portion of the air-interchange device simultaneously. Accordingly, the pressure and moisture inside the electronic display assembly are balanced with the external environment through the air-interchange device. Based on the simulation, it can be seen that although the direction of a portion of the internal circulating airflow IF near the air-interchange device is not parallel to the normal of the opening of the air-interchange device, there is air interchange via the opening of the air-interchange device.

Figure 5A:
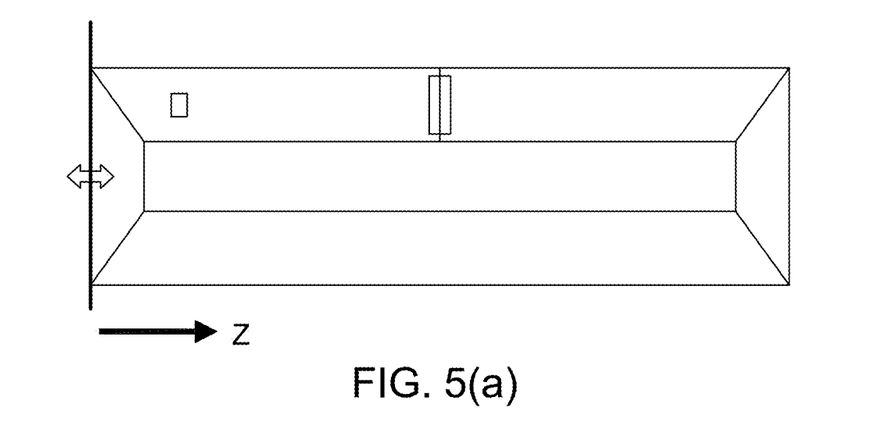
FIGS. 5(a), 5(b) and 5(c) are schematic diagrams illustrating simulation results of the airflow rate of the air-interchange device.
Figure 5B:
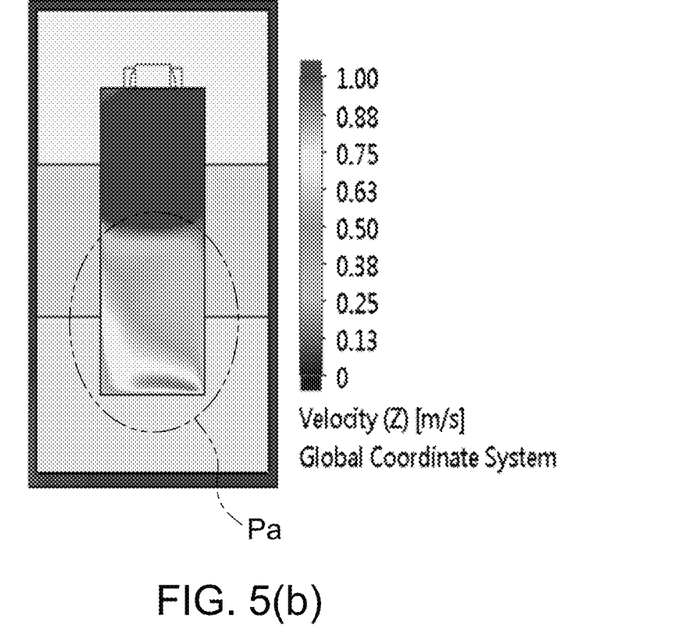
Figure 5C:
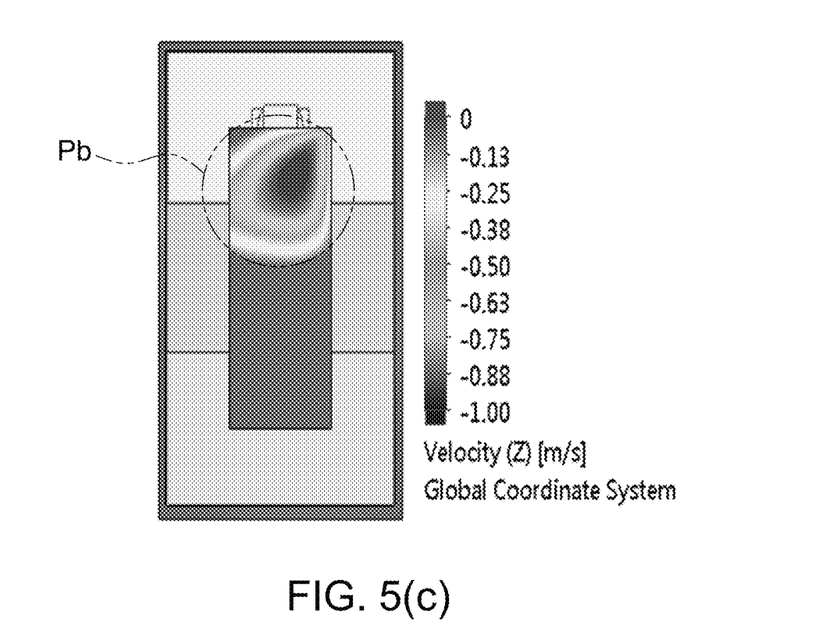

FIGS. 5(a), 5(b) and 5(c) are schematic diagrams illustrating simulation results of the airflow rate of the air-interchange device. FIG. 5(a) is a schematic diagram illustrating the measured direction. FIG. 5(b) shows that the ambient air enters the electronic display assembly via the portion Pa of the air-interchange device. FIG. 5(b) shows that the internal circulating airflow IF exits the electronic display assembly via the portion Pb of the air-interchange device. FIGS. 5(b) and 5(c) prove that the electronic display assembly will have both intake and exhaust effects via the air-interchange device when the flow generator is operated.

Figure 6:
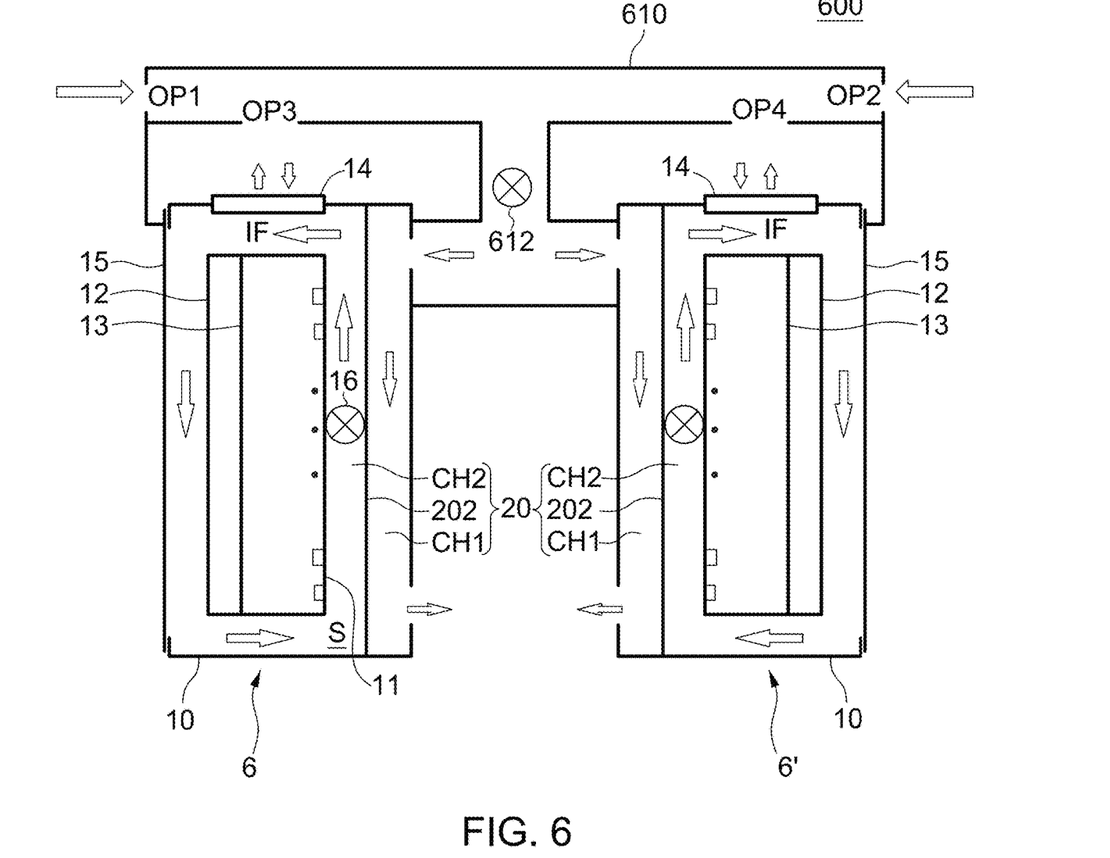
FIG. 6 is a cross-sectional view of a double-sided liquid crystal display according to some embodiments of the present disclosure.

FIG. 6 is a cross-sectional view of a double-sided liquid crystal display 600 according to some embodiments of the present disclosure. The double-sided liquid crystal display 600 comprises an electronic display assembly 6 and an electronic display assembly 6'. The difference between the electronic display assembly 6 and the electronic display assembly 6' merely lies in that the display panels face in opposite directions. In some embodiments, the electronic display assembly 6 and the electronic display assembly 6' can simultaneously display the same content. In some embodiments, the electronic display assembly 6 and the electronic display assembly 6' can display different image/video contents. The structures of the electronic display assembly 6 and 6' are similar to those of the electronic display assembly 1. Therefore, the components in the electronic display assemblies 6 and 6' of FIG. 6 with the same reference numerals as those of the electronic display assembly 1 of FIG. 1 refer to the same or similar components, and thus their detailed descriptions are not repeated here.

As shown in FIG. 6, the double-sided liquid crystal display 600 further includes a dual-sided housing 610 to accommodate a portion of the electronic display assembly 6 and a portion of the electronic display assembly 6'. The dual-sided housing 610 may have one or more openings (e.g., openings OP1, OP2, OP3 and OP4) such that the ambient air AF may flow into the double-sided liquid crystal display 600. The double-sided liquid crystal display 600 further includes a flow generator 612, such as a fan, to facilitate the circulating of the airflow in the dual-sided housing 610, Specifically, the ambient air AF may flow through the external heat dissipation channel CH1 of the heat exchanger 20 of the electronic display assemblies 6 and 6' so as to bring the heat conducted by the heat exchanger 20 to the external environment.

In some embodiments, when the double-sided liquid crystal display 600 is powered on, the flow generator 16 inside the accommodation space S of the case 10 is automatically operated so as to form an internal circulating airflow IF within the accommodation space S of the case 10. The wind pressure will lead to a ventilation effect on the air-interchange device 14. Specifically, when the internal circulating airflow IF passes through the air-interchange device 14, the air inside of the case 10 exits the electronic display assemblies 6 and 6' via the air-interchange device 14, and the ambient air enters the case 10 of the electronic display assemblies 6 and 6' via the air-interchange device 14 simultaneously. When the double-sided liquid crystal display 600 is powered off, the flow generator 16 automatically stops. As the wind pressure stops, the internal circulating airflow IF will also stop, which will cause the ventilation effect to stop synchronously. This prevents moisture from entering the accommodation space S of the case 10 when the double-sided liquid crystal display 600 is powered off.

Due to the air exchange via the air-interchange device 14, heat or moisture accumulated within accommodation space S of the case 10 can be exhausted via the air-interchange device 14 and the openings OP1, OP2, OP3, OP4 of the dual-sided housing 610, thereby reducing the temperature and humidity inside the electronic display assemblies 6 and 6'. Also, due to the air exchange via the air-interchange device 14, the pressure in the accommodation space S of electronic display assemblies 6 and 6' can be balanced with the pressure of the external environment.

Due to the screen filter of the air-interchange device 14, when the ambient air enters the case 10 of the electronic display assemblies 6 and 6' via the air-interchange device 14, the dust or dirt will be filtered by the screen filter of the air-interchange device 14; thereby avoiding any contaminants of any size from entering the electronic display assemblies 6 and 6'. When the air inside of the case 10 exits the electronic display assemblies 6 and 6' via the air-interchange device 14, the thrust of the exhaust gas pushes out the dust attached to the filter, thereby increasing the service life of the screen filter of the air-interchange device 14.

Accordingly, the present disclosure provides an electronic display assembly or a double-sided display with a dynamically adjustable airtight state inside the optical cavity, which can effectively solve the problem of deformation of optical elements in the electronic display assembly or the double-sided display and maintain the balance of temperature, pressure and humidity to extend the life of the electronic display assembly or the double-sided display.

As used herein, the singular terms "a," "an," and "the" may include plural referents unless the context clearly indicates otherwise. For example, reference to an electronic device may include multiple electronic devices unless the context clearly indicates otherwise.

As used herein, the terms "connect," "connected" and "connection" refer to an operational coupling or linking. Connected components can be directly or indirectly coupled to one another through, for example, another set of components.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless otherwise specifically indicated herein, the order and grouping of the operations are not limitations of the present disclosure.

What is claimed is:

1. An electronic display assembly comprising:
    a case with an opening;
    a display panel;
    an air-interchange device arranged in the opening of the case; and
    a first flow generator generating an internal airflow through a pathway within the case,
    wherein a direction of the internal airflow flowing adjacent to the air-interchange device on a first portion of the pathway is not parallel to a normal of the opening, and
    wherein the air-interchange device is dynamically configurable to provide an air-tight state or an open state to the pathway depending on at least one of a temperature difference and a pressure difference between an inside and outside of the pathway.

2. The electronic display assembly of claim 1, wherein the air-interchange device comprises a screen filter, a one-way breathable valve, a two-way breathable valve, or two valves with different directions.

3. The electronic display assembly of claim 1, wherein when the first flow generator is operated, ambient air enters the case of the electronic display assembly via the air-interchange device and air inside of the case exits the electronic display assembly via the air-interchange device.

4. The electronic display assembly of claim 1, wherein the first flow generator is triggered when a temperature inside of the electronic display assembly exceeds a threshold.

5. The electronic display assembly of claim 1, wherein ventilation rate of the air-interchange device is proportional to the velocity of the internal airflow generated by the first flow generator.

6. The electronic display assembly of claim 1, wherein ventilation rate of the air-interchange device is proportional to the size of an opening of the air-interchange device.

7. The electronic display assembly of claim 1, further comprising a backlight module.

8. The electronic display assembly of claim 7, further comprising a transparent plate, and wherein a second portion—of the pathway is between the transparent plate and the display panel, and a third portion of the pathway is adjacent to the backlight module opposite to the display panel.

9. The electronic display assembly of claim 8, wherein a direction of a fourth portion of the pathway is parallel to the direction of the first portion of the pathway, and a fifth portion of the pathway is between the backlight module and the display panel.

10. The electronic display assembly of claim 9, further comprising an optical film disposed between the display panel and the backlight module.

11. The electronic display assembly of claim 10, wherein the fifth portion of the pathway is arranged between the display panel and the optical film.

12. The electronic display assembly of claim 11, wherein a sixth portion—of the pathway is arranged between the optical film and the backlight module.

13. The electronic display assembly of claim 7, further comprising:
a heat exchanger attached to the backlight module and having a first channel, wherein ambient air flows through the first channel.

14. The electronic display assembly of claim 13, wherein the heat exchanger further comprises a second channel adjacent to the backlight module.

15. The electronic display assembly of claim 13, further comprising a second flow generator that generates ambient airflow through the first channel.

16. The electronic display assembly of claim 1, wherein the normal of the opening is not parallel to a normal of the display panel.

17. An electronic display assembly comprising:
a case;
a transparent plate;
a display module;
an air-interchange device sealed within the case for ventilating the electronic display assembly with airflow with more than one direction;
an external flow generator, introducing an ambient airflow in the external heat dissipation channel; and
an internal flow generator, disposed within the case,
wherein the flow generator generates an internal airflow between the transparent plate and the display module and passing adjacent to the air-interchange device, and wherein
the air-interchange device is dynamically configurable to provide an air-tight state or an open state to a pathway of the internal airflow depending on at least one of a temperature difference and a pressure difference between an inside and outside of the pathway.

18. The electronic display assembly of claim 17, wherein the air-interchange device comprises a screen filter, a one-way breathable valve, a two-way breathable valve, or two valves with different directions.

19. The electronic display assembly of claim 17, wherein when the flow generator is operated, ambient air enters the case of the electronic display assembly via the air-interchange device and air inside of the case exits the electronic display assembly via the air-interchange device.

20. A double-sided display comprising:
a first electronic display assembly according to any one of claims 1-19;
a second electronic display assembly according to any one of claims 1-19; and
a dual-sided housing with an opening, for accommodating a portion of the first electronic display assembly and a portion of the second electronic display assembly.

\* \* \* \* \*